(12) United States Patent
Miller, Jr. et al.

(10) Patent No.: US 7,741,879 B2
(45) Date of Patent: Jun. 22, 2010

(54) APPARATUS AND METHOD FOR GENERATING A CONSTANT LOGICAL VALUE IN AN INTEGRATED CIRCUIT

(75) Inventors: Robert Harry Miller, Jr., Loveland, CO (US); Gilbert Yoh, Fort Collins, CO (US); Robert J. Martin, Timnath, CO (US)

(73) Assignee: Avago Technologies Enterprise IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 11/677,902

(22) Filed: Feb. 22, 2007

(65) Prior Publication Data
US 2008/0204082 A1    Aug. 28, 2008

(51) Int. Cl.
*H03K 19/20* (2006.01)
(52) U.S. Cl. .................... 326/104; 326/105
(58) Field of Classification Search ............ 326/38, 326/104, 105, 106, 108, 109, 56–58, 27, 326/87
See application file for complete search history.

(56) References Cited

U.S. PATENT DOCUMENTS

| | | | | |
|---|---|---|---|---|
| 4,570,091 A | * | 2/1986 | Yasuda et al. | 326/87 |
| 5,034,629 A | * | 7/1991 | Kinugasa et al. | 326/27 |
| 5,120,999 A | * | 6/1992 | Schreck et al. | 326/27 |
| 5,373,514 A | * | 12/1994 | Ma | 714/811 |
| 5,646,550 A | * | 7/1997 | Campbell et al. | 326/81 |
| 6,066,958 A | * | 5/2000 | Taniguchi et al. | 326/27 |
| 6,531,888 B2 | * | 3/2003 | Abbott | 326/38 |
| 6,696,864 B2 | * | 2/2004 | Yamashita et al. | 326/113 |

* cited by examiner

*Primary Examiner*—James H. Cho
*Assistant Examiner*—Crystal L Hammond (57) ABSTRACT

An apparatus for generating a constant logical value in an integrated circuit includes a first logic network having n outputs, the n outputs providing $2^n$ possible output combinations, where the n outputs assume a state that is a subset of the $2^n$ possible output combinations and a second logic network configured to generate at least one constant logic signal when the n outputs assume any state that is part of the subset of the $2^n$ possible output combinations.

14 Claims, 8 Drawing Sheets

APPARATUS AND METHOD FOR GENERATING A CONSTANT LOGICAL VALUE IN AN INTEGRATED CIRCUIT

BACKGROUND

Integrated circuits are designed using various processing and switching technology. An example of an integrated circuit switching technology that is commonly used makes use of switching devices that are referred to as field effect transistors. A field effect transistor (FET) is a semiconductor device that can be fabricated as an n-type device or a p-type device, and can be fabricated using a variety of processing technologies. Non-limiting examples of fabrication technologies are referred to as metal oxide semiconductor (MOS) and complementary metal oxide semiconductor (CMOS). There are many other examples of processing technologies. Integrated circuit designs are typically constrained by a number of different design requirements. For example, an integrated circuit design may be constrained by the fabrication process that will be used to fabricate the integrated circuit chip. One design constraint involves the connection of a gate terminal of a FET to a constant logical value instead of to a supply voltage. Therefore, it would be desirable to generate a constant logic value.

SUMMARY

In an embodiment, an apparatus for generating a constant logical value in an integrated circuit comprises a first logic network having n outputs, the n outputs providing $2^n$ possible output combinations, where the n outputs assume a state that is a subset of the $2^n$ possible output combinations and a second logic network configured to generate at least one constant logic signal when the n outputs assume any state that is part of the subset of the $2^n$ possible output combinations.

BRIEF DESCRIPTION OF THE DRAWINGS

The invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION

Embodiments of the apparatus and method for generating a constant logical value in an integrated circuit to be described below will be described in the context of generating constant logical values in an integrated circuit. However, the constant logical values can be applicable to other types of circuitry in which constant logical values are used. Further, many instances of the apparatus for generating a constant logical value in an integrated circuit can be implemented on an integrated circuit. All such implementations are within the scope of this disclosure.

Figure 1:
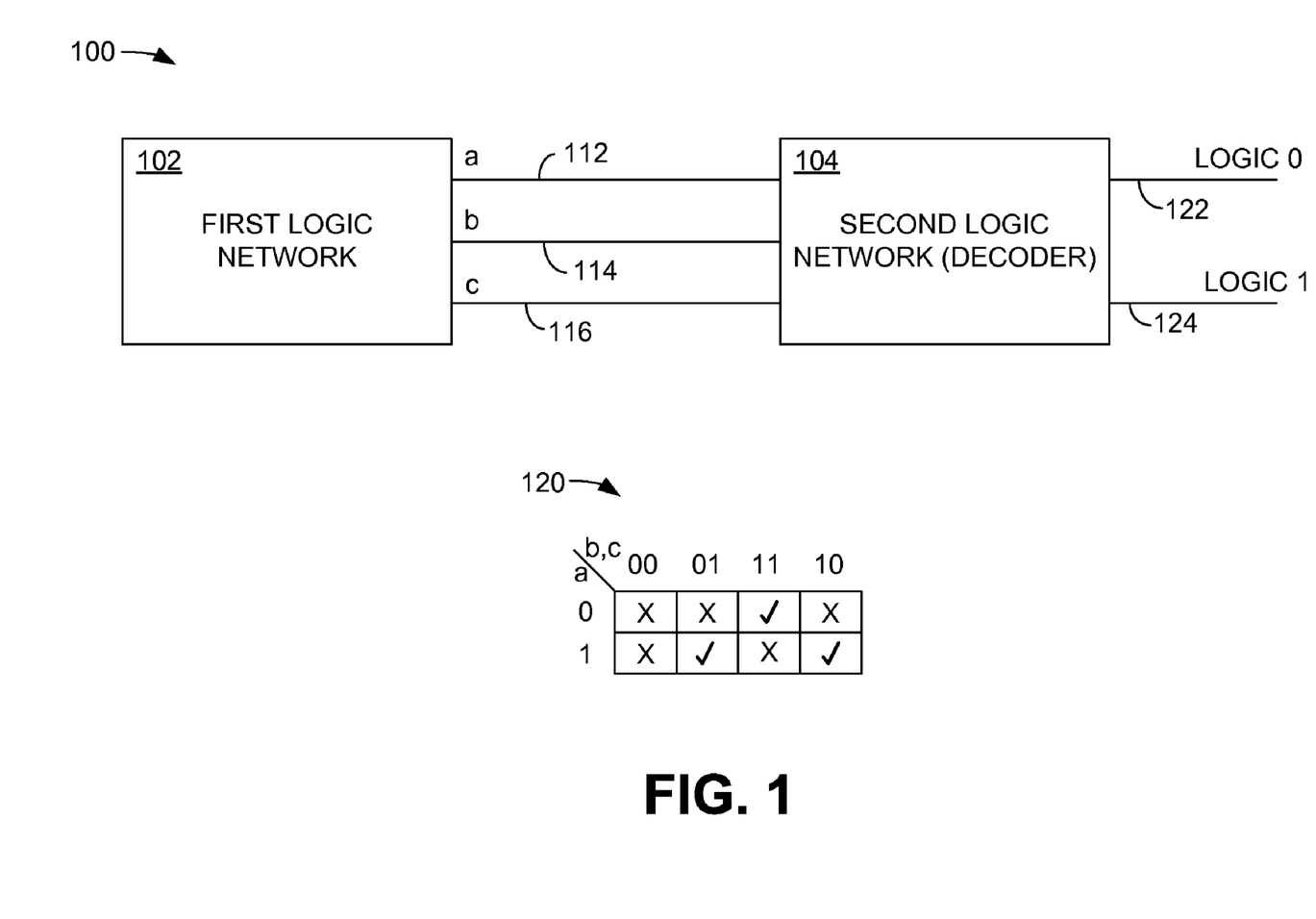
FIG. 1 is a block diagram illustrating an embodiment of an apparatus for generating a constant logical value in an integrated circuit.

FIG. 1 is a block diagram illustrating an embodiment of an apparatus for generating a constant logical value in an integrated circuit. The apparatus for generating a constant logical value is also referred to as a "constant logic cell" or a "tie cell." The terminology "tie cell" refers to the ability of the logic to provide a constant logical value regardless of the logic values of the inputs. The constant logic cell 100 comprises a first logic network 102 and a second logic network 104. The second logic network 104 operates to decode the logic signals provided by the first logic network 102.

The first logic network 102 has n outputs. In this example, the logic network 102 has three outputs; therefore, in this example, n=3. A first output of the first logic network 102 is provided on connection 112 and is referred to as the output "a." A second output of the first logic network 102 is provided on connection 114 and is referred to as the output "b." A third output of the first logic network 102 is provided on connection 116 and is referred to as the output "c." The n outputs of the first logic network 102 provide $2^n$ possible output combinations. In accordance with an embodiment, the n outputs, in this example, a, b and c, assume a state that is a subset of the eight (8) possible output combinations. Conversely, the n outputs, a, b and c, never assume at least one of the eight (8) possible output combinations.

An example of a set of "n" outputs whose state is a known subset of all possible ($2^n$) states of "n" outputs is provided. In this example, "n"=3 and the outputs a, b and c are shown in the truth table 120. In this example, the values of the outputs a, b and c are any of the three combinations illustrated using a "check' mark in the truth table 120 to indicate a "valid state." An "X" in the truth table 120 indicates an "invalid state." Any state that is in the subset of the $2^n$ states that can be assumed is defined as a "valid state," and conversely, any state that is in the subset of the $2^n$ states that cannot be assumed is defined as an "invalid state." In this example, the three combinations of the outputs a, b and c that yield a valid state are 011, 101 and 110.

The second logic network 104, which will also be referred to as a decoder, generates a constant logic high and/or a constant logic low signal when the n outputs assume any state that is part of the subset of the $2^n$ possible output combinations.

A constant logic high is provided by the second logic network 104 over connection 124 and a constant logic low is provided by the second logic network 104 over connection 122.

Figure 2:
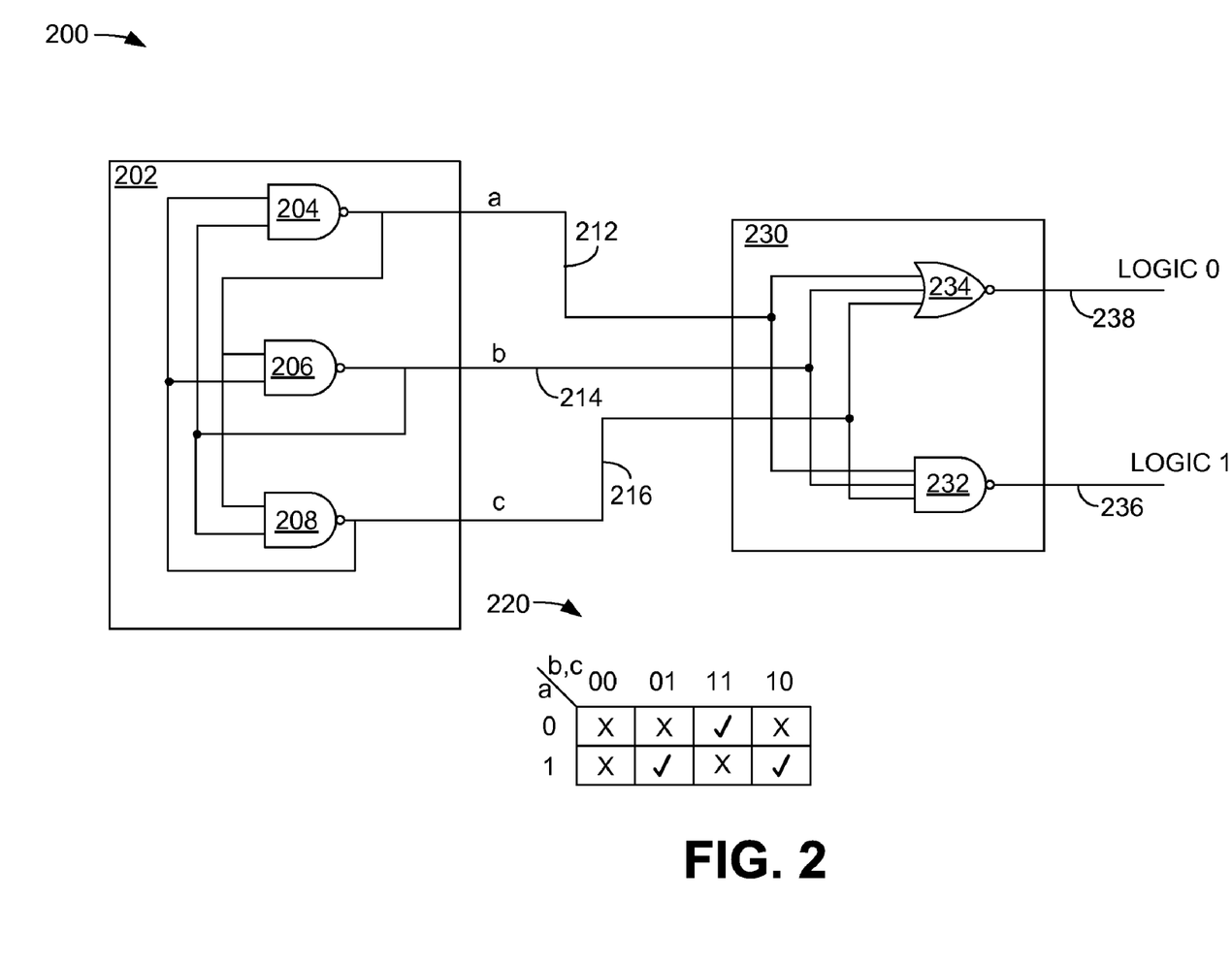
FIG. 2 is a block diagram illustrating an embodiment of an apparatus for generating a constant logical value in an integrated circuit.

FIG. 2 is a block diagram illustrating an embodiment of an apparatus for generating a constant logical value in an integrated circuit. The apparatus shown in FIG. 2 is one example of an implementation of a constant logic cell. Other implementations are possible.

The constant logic cell 200 comprises a plurality of interconnected logic gates 202. In this example, the plurality of interconnected logic gates 202 comprises NAND gates 204, 206 and 208. The NAND gates 204, 206 and 208 are coupled such that the output of each of the NAND gates is coupled to the inputs of each of the other NAND gates. In this example, the output of NAND gate 204 is coupled to one of the inputs of the NAND gates 206 and 208. The output of NAND gate 206 is coupled to one of the inputs of the NAND gates 204 and 208. The output of NAND gate 208 is coupled to one of the inputs of the NAND gates 204 and 206.

An output of the NAND gate 204 is provided on connection 212 and is referred to as the output "a." An output of the NAND gate 206 is provided on connection 214 and is referred to as the output "b." An output of the NAND gate 208 is provided on connection 216 and is referred to as the output "c."

When the NAND gates 204, 206 and 208 are connected as shown, a set of "n" outputs whose state is a known subset of all possible ($2^n$) states of "n" outputs is provided. In this example, "n"=3 and the outputs a, b and c are shown in the truth table 220. In this example, the values of the outputs a, b and c are any of the three combinations illustrated using a "check' mark in the truth table 220 to indicate a "valid state." An "X" in the truth table 220 indicates an "invalid state." In this example, the three combinations of the outputs a, b and c that yield a valid state are 011, 101 and 110.

The constant logic cell 200 also comprises a logic network 230. The logic network 230 comprises a first logic 232 and a second logic 234. In this example, the first logic 232 is a NAND gate and is configured to receive the outputs a, b and c over connections 212, 214 and 216, respectively. In this example, the second logic 234 is a NOR gate and is also configured to receive the outputs a, b and c over connections 212, 214 and 216, respectively.

The logic network 230 produces either a logic "1" for all values of the known subset (a, b and c being any of 011, 101 and 110) and/or a "0" for all such values of the known subset (a, b and c being any of 011, 101 and 110) or both.

The output of the NAND gate 232 on connection 236 is always a logic high if the output of the set of interconnected logic gates 202 provides at least one logic low signal. The output of the NOR gate 234 on connection 238 is always a logic low if the output of the set of interconnected logic gates 202 provides at least one logic high signal. It should also be noted that the possible or valid states for the output of logic gates 202 always meet the "at least one logic high signal" and the "at least one logic low signal" constraints, therefore leading to the constant logic 1 and logic 0 outputs of logic network 230. In this manner, the constant logic cell 200 is constructed using simple logic gates.

Figure 3:
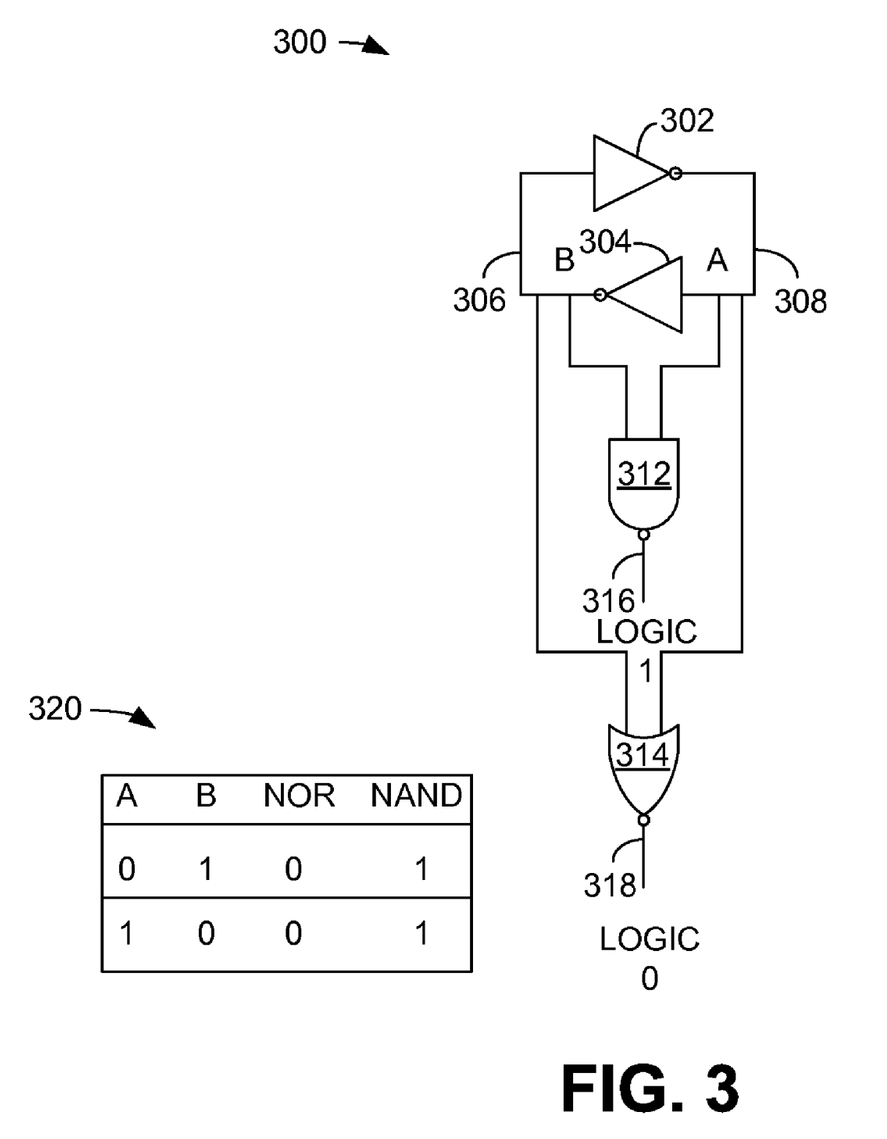
FIG. 3 is a block diagram illustrating another embodiment of an apparatus for generating a constant logical value in an integrated circuit.

FIG. 3 is a block diagram illustrating an alternative embodiment of an apparatus for generating a constant logical value in an integrated circuit.

The constant logic cell 300 comprises a pair of inverters 302 and 304. The inverters 302 and 304 are connected in a configuration that is referred to as "cross-coupled." The output 308 of the inverter 302 is the input of the inverter 304. The output 306 of the inverter 304 is the input of the inverter 302. When there is a logic low on the connection 306, there is a logic high on the connection 308. Similarly, when there is a logic high on the connection 306, there is a logic low on the connection 308. The signal on connection 308 is referred to as the input "A" and the signal on connection 308 is referred to as the input "B."

The constant logic cell 300 also comprises a first logic 312 and a second logic 314. The first logic 312 is implemented as a NAND gate and the second logic 314 is implemented as a NOR gate. Each of the first logic 312 and the second logic 314 receives as input the logic values on connections 306 and 308. As mentioned above, when there is a logic low on the connection 306, there is a logic high on the connection 308 and when there is a logic high on the connection 306 there is a logic low on the connection 308. In this manner, the inputs to the first logic gate 312 and the second logic gate 314 will always be opposite logic value. A partial truth table for the first logic 312 and the second logic 314 is illustrated in the truth table 320. When the inputs A and B are of opposite logical value, the output of the first logic 312 (the NAND gate) is always a logic high (a logic 1) and the output of the second logic 314 (the NOR gate) is always a logic low (a logic 0). The output of the first logic 312 on connection 316 is a constant logic high and the output of the second logic 314 on connection 318 is a constant logic low.

Figure 4:
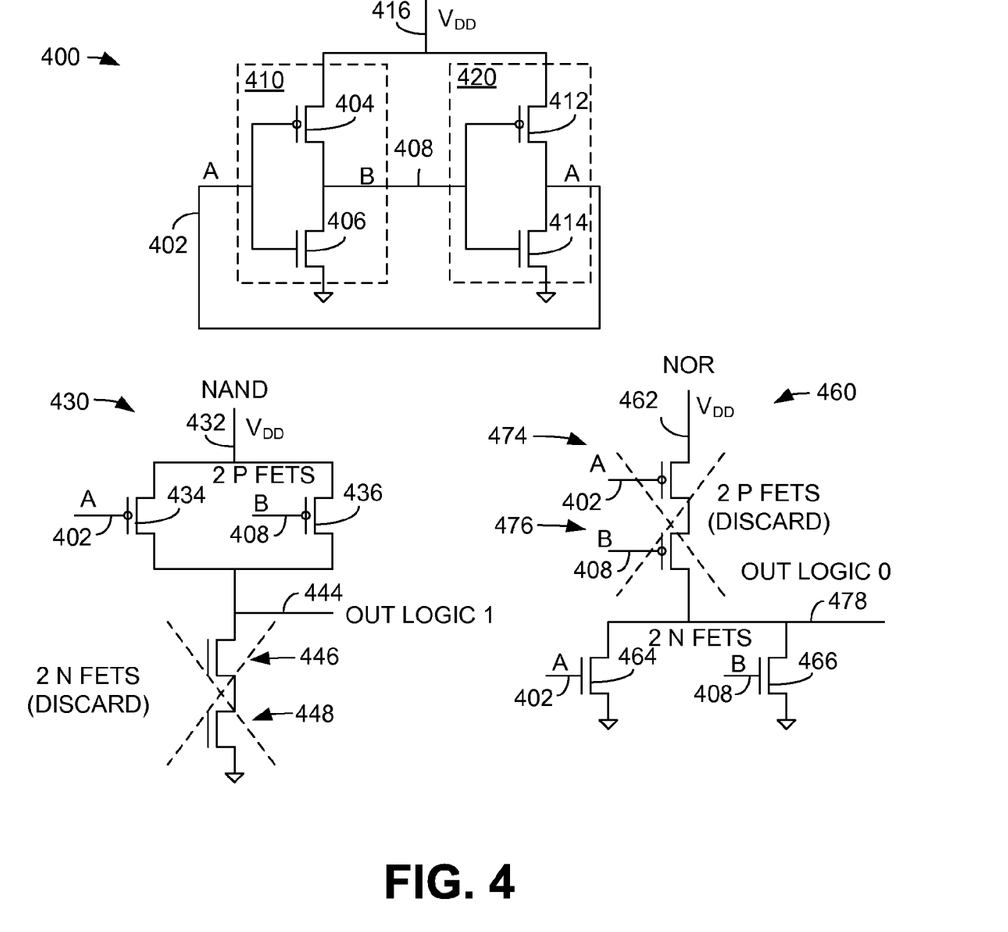
FIG. 4 is a schematic diagram illustrating an embodiment of an implementation of the apparatus for generating a constant logical value in an integrated circuit of FIG. 3.

FIG. 4 is a schematic diagram illustrating an embodiment of an implementation of the apparatus for generating a constant logical value in an integrated circuit of FIG. 3. The constant logic cell 400 comprises inverters 410 and 420. The inverters 410 and 420 are implemented using field effect transistor (FET) technology. However, the inverters 410 and 420, and the balance of the constant logic cell 400, may be implemented using switching technology other then FET technology. The inverter 410 comprises a p-type FET 404 and an n-type FET 406. The inverter 420 comprises a p-type FET 412 and an n-type FET 414. An input signal is provided to the inverter 410 via connection 402. The output of the inverter 410 is provided on connection 408. The output of the inverter 410 is supplied as input to the inverter 420. The output of the inverter 420 is supplied via connection 402. The signals on connections 402 and 408 are always of opposite logic value. If the logic level on connection 402 is logic high, then the logic level on connection 408 is logic low. Similarly, if the logic level on connection 402 is logic low, then the logic level on connection 408 is logic high. In this manner, the signals A and B will always be of opposite logic value.

The constant logic cell 400 also comprises logic 430 that is implemented as a NAND gate. The logic 430 comprises p-type FETs 434 and 436 coupled in parallel. The logic 430 also comprises n-type FETs 446 and 448 coupled in series. However, because the only output provided by the logic 430 is a logic high, the n-type FETs 446 and 448 have no effect on the logical output of the circuit and therefore may be omitted.

The input to the FET 434 on connection 402 is the signal labeled "A" and the input to the FET 436 on connection 408 is the signal labeled "B." However, this designation is arbitrary. The inputs A and B can be switched to connections 408 and 402, respectively. As mentioned above, the value of the signals A and B will always be of opposite logic value. In this manner, the output of the logic 430 on connection 444 will always be a logic high.

The constant logic cell 400 also comprises logic 460 that is implemented as a NOR gate. The logic 460 comprises n-type FETs 464 and 466 coupled in parallel. The logic 460 also comprises p-type FETs 474 and 476 coupled in series. However, because the only output provided by the logic 460 is a logic low, the p-type FETs 474 and 476 have no effect on the logical output of the circuit and therefore may be omitted.

The input to the FET 464 on connection 402 is the signal labeled "A" and the input to the FET 466 on connection 408 is the signal labeled "B." However, this designation is arbitrary. The inputs A and B can be switched to connections 408 and 402, respectively. As mentioned above, the value of the signals A and B will always be of opposite logic value. In this manner, the output of the logic 460 on connection 478 will always be a logic low.

Figure 5:
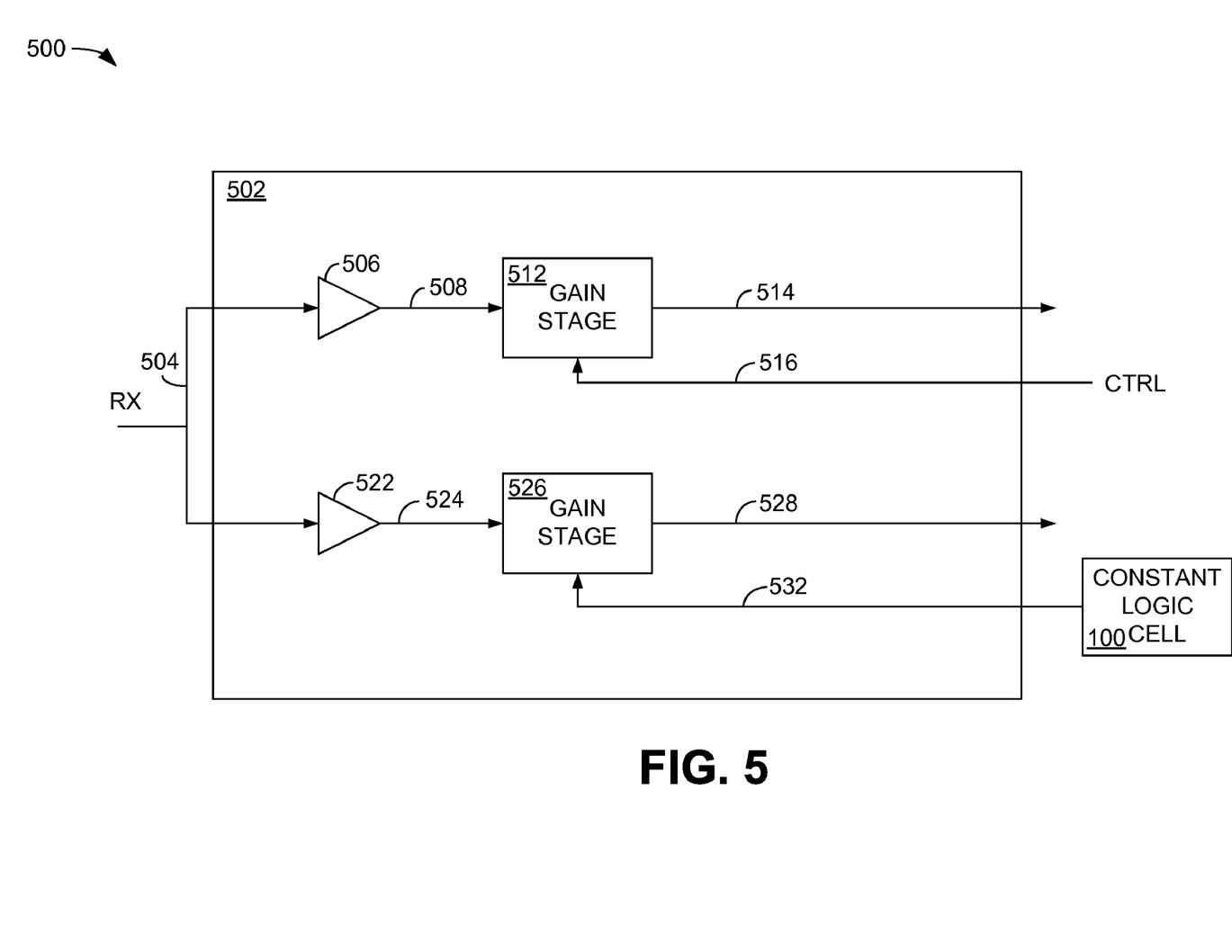
FIG. 5 is a block diagram illustrating an embodiment of the apparatus for generating a constant logical value implemented in a portion of in integrated circuit.

FIG. 5 is a block diagram illustrating an embodiment of the apparatus for generating a constant logical value implemented in a portion of in integrated circuit. The circuit portion 502 can be, for example, a receiver that is part of an integrated serializer/deserializer (SERDES). However, the constant logic cell 100, 200 or 300 can be utilized in many other types of circuitry. For example, the constant logic cell 100 can be utilized in a functional design block with various input and output connections, at least one of which is a logical input that should be connected to a constant logic value, i.e., either a logic high or a logic low. The present invention provides for such a connection to be made without connecting the input to a power supply by using only simple logic gates as described above and which are commonly found in existing design libraries. Such an implementation as described above does not require transistor-level design to accomplish.

The circuit portion 502 comprises low noise amplifiers 506 and 522 that are coupled to receive a received signal on connection 504. The output of the LNA 506 is directed via connection 508 to a gain stage 512. The gain stage 512 can be any active amplification device that applies gain to the signal on connection 508. The output of the gain stage 512 on connection 514 is directed to other circuit elements that are omitted for simplicity.

The gain of the gain stage 512 is typically controlled by a control signal that is applied to the gain stage 512 via connection 516. An example of a control signal is a voltage signal generated elsewhere in the integrated circuit and that is used to determine the gain setting of the gain stage 512.

The output of the LNA 522 is directed via connection 524 to a gain stage 526. The gain stage 526 can be any active amplification device that applies gain to the signal on connection 524. The output of the gain stage 526 on connection 528 is directed to other circuit elements that are omitted for simplicity.

The gain of the gain stage 526 is typically controlled by a control signal that is applied to the gain stage 526 via connection 532. In this example, it is desirable to maintain the gain stage 526 at a constant setting. In the embodiment of FIG. 5, a constant logic cell 100 can apply a constant logic value to the gain stage 526 via connection 532. The constant logic value can be a logic high or a logic low, as described above. In this manner, the gain of the gain stage 526 is maintained at a constant level.

Figure 6:
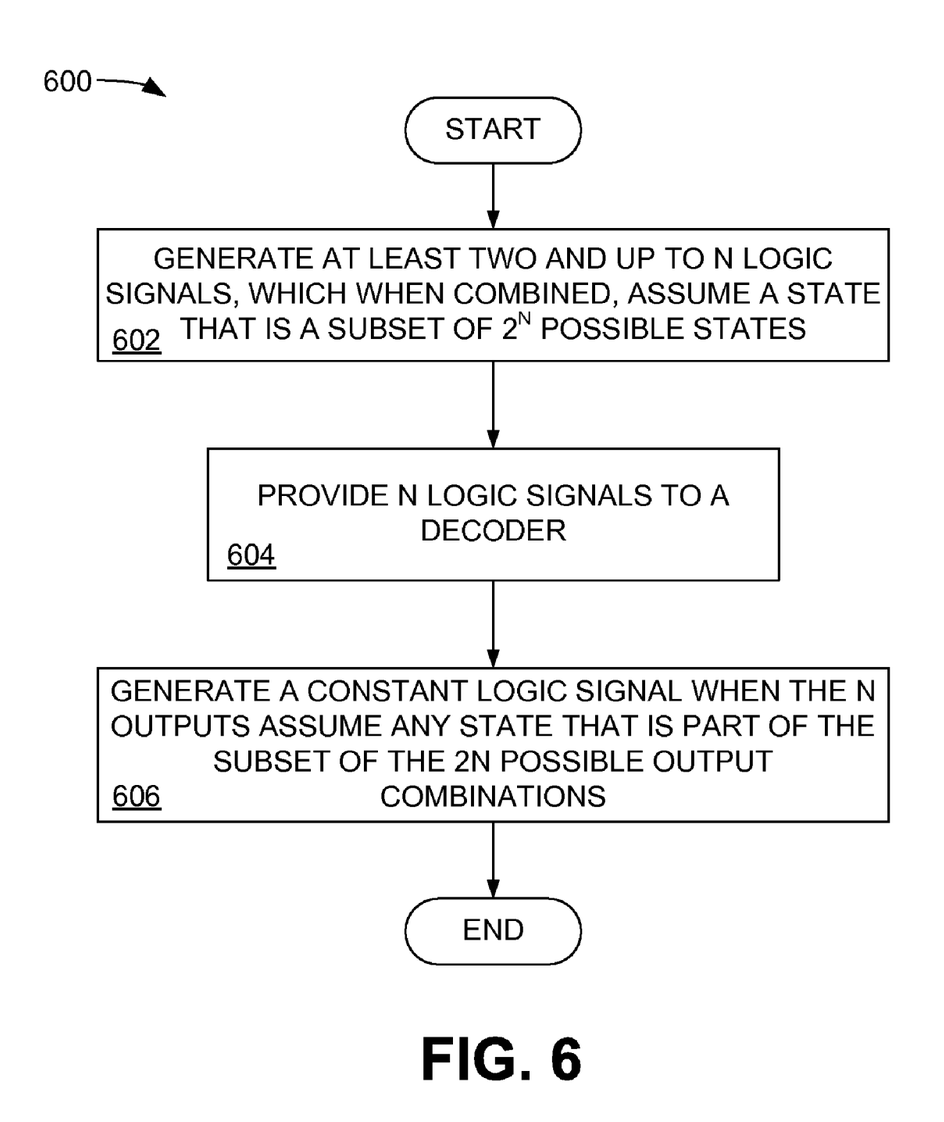
FIG. 6 is a flowchart showing the operation of an embodiment of a method for generating a constant logical value in an integrated circuit.

FIG. 6 is a flowchart showing the operation of an embodiment of a method for generating a constant logical value in an integrated circuit. In block 602, a first logic network 102 (FIG. 1) having n outputs provides $2^n$ possible output combinations, which assume a state that is a subset of the $2^n$ possible output combinations. In block 604, the logic signals are provided to a second logic network, such as a decoder 104 (FIG. 1). In block 606, the decoder 104 generates a constant logic high signal and/or a constant logic low signal when the n outputs assume any state that is part of the subset of the $2^n$ possible output combinations.

Figure 7:
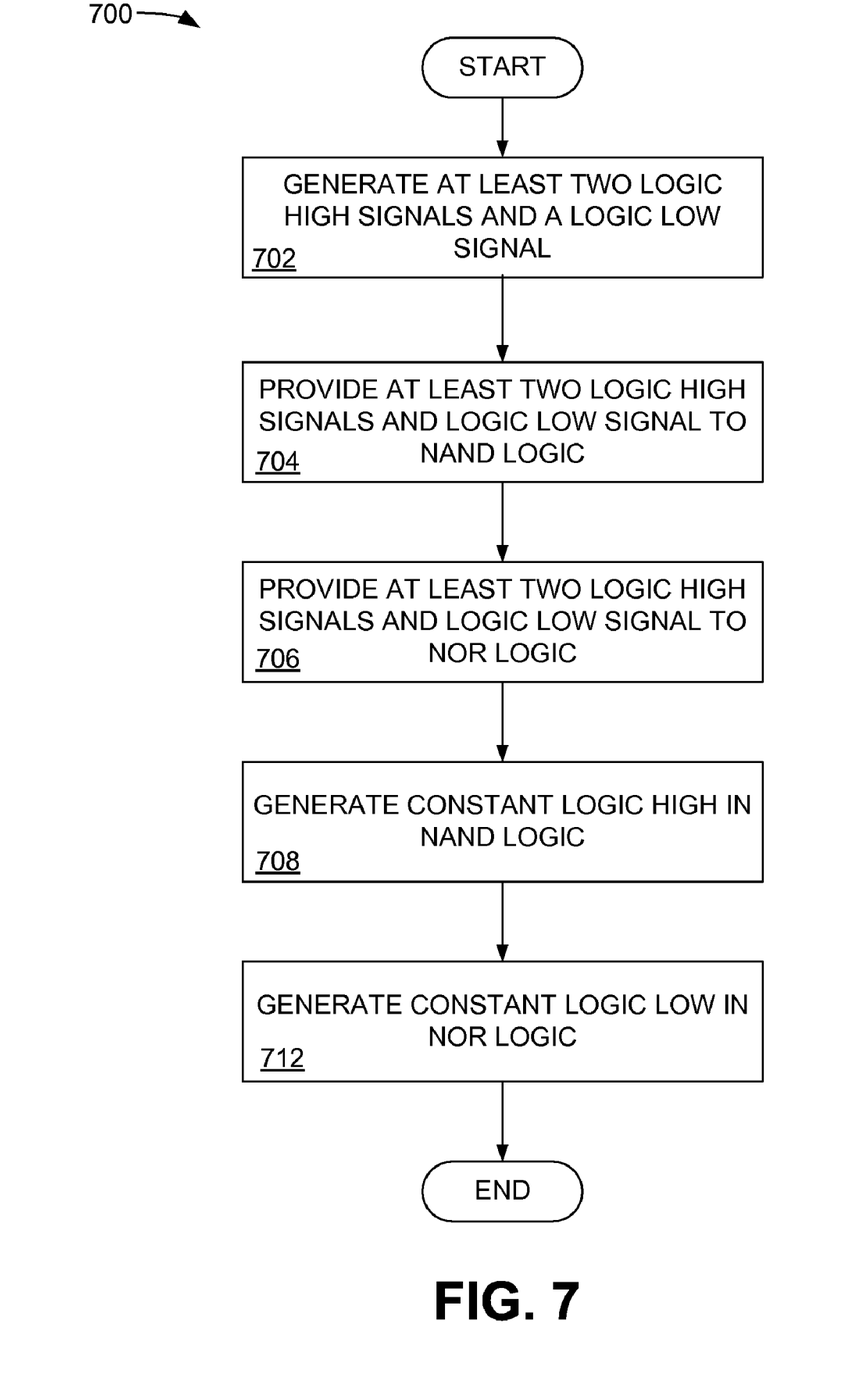
FIG. 7 is a flowchart showing the operation of an alternative embodiment of a method for generating a constant logical value in an integrated circuit.

FIG. 7 is a flowchart showing the operation of an alternative embodiment of a method for generating a constant logical value in an integrated circuit. In block 702, the set of interconnected logic gates 202 generate at least two logic high signals and a logic low signal. In block 704, the at least two logic high signals and the logic low signal are provided to a first logic. In this example, the first logic can be a NAND gate 232 (FIG. 2). In block 706, the at least two logic high signals and the logic low signal are provided to a second logic. In this example, the second logic can be a NOR gate 234 (FIG. 2). In block 708 the first logic 232 (FIG. 2) generates a constant logic high value. In block 712, the second logic 234 (FIG. 2) generates a constant logic low value.

Figure 8:
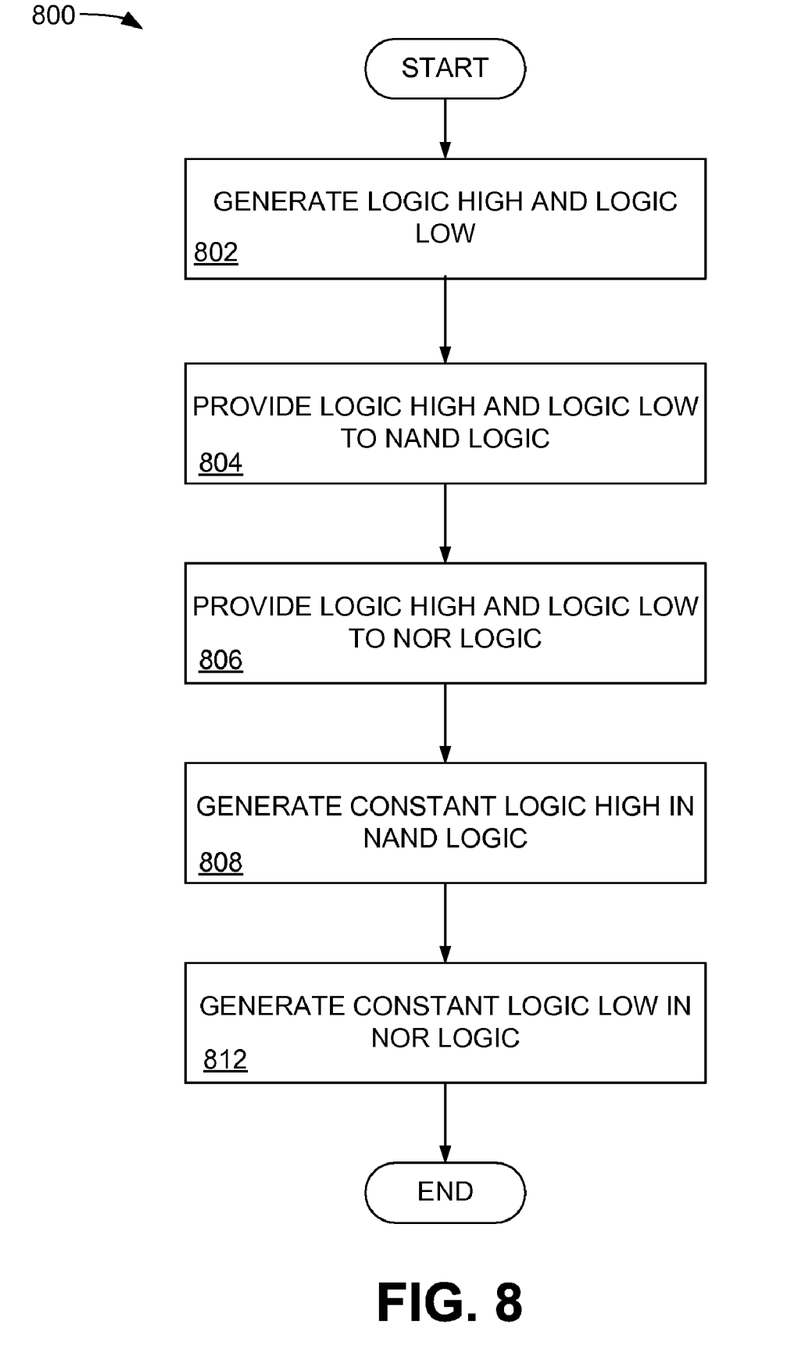
FIG. 8 is a flowchart showing the operation of another alternative embodiment of a method for generating a constant logical value in an integrated circuit.

FIG. 8 is a flowchart showing the operation of another alternative embodiment of a method for generating a constant logical value in an integrated circuit. In block 802, the inverters 302 and 304 (FIG. 3) generate a logic high and a logic low signal. In block 804, the logic high and the logic low signals are provided to a first logic. In this example, the first logic can be a NAND gate 312 (FIG. 3). In block 806, the logic high and the logic low signals are provided to a second logic. In this example, the second logic can be a NOR gate 314 (FIG. 3). In block 808 the first logic 312 (FIG. 3) generates a constant logic high value. In block 812, the second logic 314 (FIG. 3) generates a constant logic low value.

It is possible to decode a logic "low" using the cross-coupled inverters 302 and 304 by decoding that both signals A and B are low, which corresponds to one of two invalid states. This is accomplished in the example of FIG. 3 using the NOR gate 314. It is also possible to decode a logic "high" by decoding that both signals A and B are high, which corresponds to the other invalid state. This is accomplished in the example of FIG. 3 using the NAND gate 312. It is also possible to decode a logic "low" using an exclusive nor (XNOR) gate, which would decode that both signals A and B are logic low or both signals A and B are logic high. However, this is more complicated than what is described above. A similar discussion can be made for the logic "high" decoder, which can simply be an inverter connected to the logic "low" decoder. A logic "high" would be decoded by a NAND gate, an OR gate, or an XOR gate coupled to the two inputs A and B.

This disclosure describes the invention in detail using illustrative embodiments. However, it is to be understood that the invention defined by the appended claims is not limited to the precise embodiments described.

What is claimed is:

1. An apparatus for generating a constant logical value in an integrated circuit, comprising:
  a first logic network comprising first logical elements, each first logical element comprising at least one gate, no gates of the first logical elements being connected directly to a power supply, the first logic network having no logical input signals connected or provided thereto, the first logic network being configured to provide n outputs, the n outputs providing $2^n$ possible output combinations, where the n outputs assume a state that is a subset of the $2^n$ possible output combinations; and
  a second logic network operably connected to the first logic network to receive the outputs therefrom and configured as a decoder to generate at least one constant logic signal when the n outputs assume any state that is part of the subset of the $2^n$ possible output combinations.

2. The apparatus of claim 1, wherein the first logic network further comprises a set of interconnected logic gates configured to provide at least one logic low signal and at least one logic high signal.

3. The apparatus of claim 2, wherein the set of interconnected logic gates comprises a plurality of NAND gates.

4. The apparatus of claim 3, wherein the plurality of NAND gates are coupled such that an output of each of the NAND gates is supplied to an input of each of the other NAND gates.

5. The apparatus of claim 1, wherein the second logic network further comprises:

a first logic gate configured to generate a constant logic high signal when the assumed state of the n outputs includes at least one logic low signal; and a second logic gate configured to generate a constant logic low signal when the assumed state of the n outputs includes at least one logic high signal.

6. The apparatus of claim 5, wherein the first logic gate in the second logic network is a NAND gate.

7. The apparatus of claim 5, wherein the second logic gate in the second logic network is a NOR gate.

8. A method for generating a constant logical value in an integrated circuit, comprising:

generating n outputs having $2^n$ possible output combinations using first logical elements disposed in a first logic network, each first logical element comprising at least one gate, no gates of the first logical elements being connected directly to a power supply, the first logic network having no logical input signals connected or provided thereto, where the n outputs assume a state that is a subset of the $2^n$ possible output combinations; and decoding the n outputs to generate a constant logic signal when the n outputs assume any state that is part of the subset of the $2^n$ possible output combinations.

9. The method of claim 8, further comprising generating the n outputs using a set of interconnected logic gates configured to provide at least one logic low signal and at least one logic high signal.

10. The method of claim 9, further comprising implementing the set of interconnected logic gates using a plurality of NAND gates.

11. The method of claim 10, further comprising coupling the plurality of NAND gates such that an output of each of the NAND gates is supplied to an input of each of the other NAND gates.

12. The method of claim 8, wherein the decoding further comprises:

generating a constant logic high signal when the assumed state of the n outputs includes at least one logic low signal; and generating a constant logic low signal when the assumed state of the n outputs includes at least one logic high signal.

13. The method of claim 12, wherein the constant logic high signal is generated using a NAND gate.

14. The method of claim 12, wherein the constant logic low signal is generated using a NOR gate.

* * * * *